United States Patent
Liu et al.

(10) Patent No.: US 6,586,347 B1
(45) Date of Patent: *Jul. 1, 2003

(54) METHOD AND STRUCTURE TO IMPROVE THE RELIABILITY OF MULTILAYER STRUCTURES OF FSG (F-DOPED SIO2) DIELECTRIC LAYERS AND METAL LAYERS IN SEMICONDUCTOR INTEGRATED CIRCUITS

(75) Inventors: Chung-Shi Liu, Hsin-Chu (TW); Hui-Ling Wang, Hsin-chu (TW); Szu-An Wu, Hsin-Chu (TW); Chun-Ching Tsan, Tou-Liu (TW); Ying Lang Wang, Tien-chung Village (TW); Tong Hua Kuan, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/978,229

(22) Filed: Oct. 16, 2001

(51) Int. Cl.$^7$ .................. H01L 21/31; H01L 21/469
(52) U.S. Cl. .................. 438/778; 257/758; 257/760
(58) Field of Search .................. 257/758, 760; 438/622, 624, 778

(56) References Cited

U.S. PATENT DOCUMENTS

| | | | |
|---|---|---|---|
| 5,567,635 A | 10/1996 | Acovic et al. | 437/43 |
| 5,756,396 A | 5/1998 | Lee et al. | 438/622 |
| 5,830,804 A | 11/1998 | Cleeves et al. | 438/672 |
| 5,858,875 A | 1/1999 | Chung et al. | 438/634 |
| 6,174,797 B1 * | 1/2001 | Bao et al. | 438/624 |
| 6,380,066 B1 * | 4/2002 | See et al. | 438/624 |
| 6,451,687 B1 * | 9/2002 | Liu et al. | 438/624 |
| 6,458,722 B1 * | 10/2002 | Kapoor et al. | 438/788 |
| 6,489,230 B1 * | 12/2002 | Huang | 438/624 |

* cited by examiner

*Primary Examiner*—Hoai Ho
*Assistant Examiner*—Tu-Tu Ho
(74) *Attorney, Agent, or Firm*—George O. Saile; Stephen B. Ackerman

(57) ABSTRACT

An improved composite dielectric structure and method of forming thereof which prevents delamination of FSG (F-doped $SiO_2$) and allows FSG to be used as the interlevel dielectric between successive conducting interconnection patterns in multilevel integrated circuit structures has been developed. The composite dielectric structure comprises FSG, undoped silicon oxide (optional), silicon-rich silicon oxide and silicon nitride. The silicon-rich silicon oxide layer having a thickness between about 1000 and 2000 Angstroms prevents reaction of F atoms from the FSG layer with the silicon nitride layer during subsequent manufacturing heat treatment cycles and prevents the deleterious formation of delamination bubbles which cause peeling of the FSG layer.

32 Claims, 2 Drawing Sheets

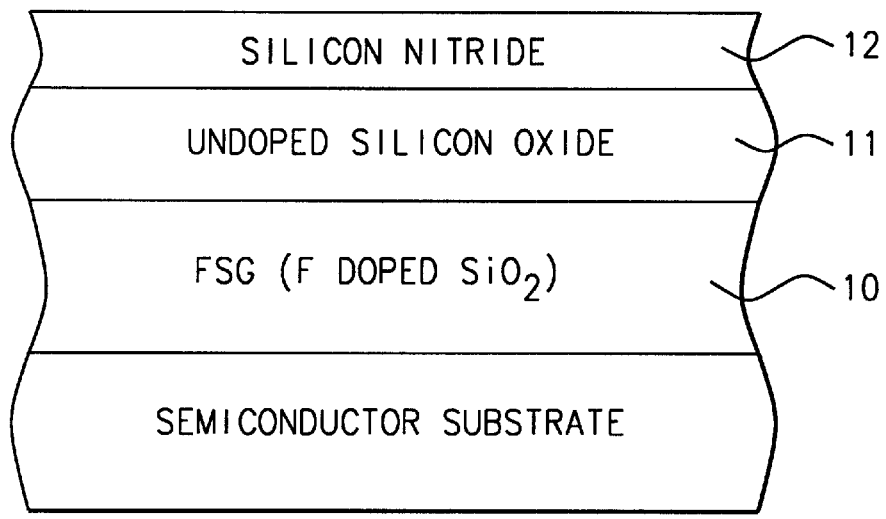
FIG. 1 - Prior Art
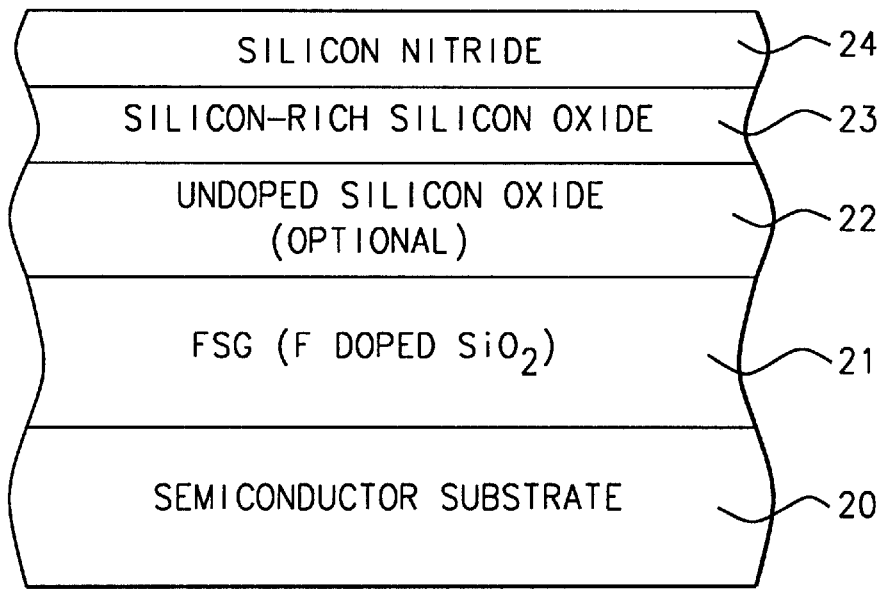
FIG. 2 though the undoped silicon oxide and into the silicon nitride layer. During heat treatment cycles the FSG layer reacts with the silicon nitride layer, delamination bubbles occur, and the FSG layer begins to peel.

METHOD AND STRUCTURE TO IMPROVE THE RELIABILITY OF MULTILAYER STRUCTURES OF FSG (F-DOPED SIO2) DIELECTRIC LAYERS AND METAL LAYERS IN SEMICONDUCTOR INTEGRATED CIRCUITS

BACKGROUND OF THE INVENTION

(1) FIELD OF THE INVENTION

This invention relates to semiconductor integrated circuits and more specifically to a method of fabrication used for semiconductor integrated circuit devices, whereby the reliability and interlevel adhesion of multilayer structures of FSG (F-doped $SiO_2$) dielectric layers and metal conducting layers are improved.

(2) DESCRIPTION OF RELATED ART

In the fabrication of semiconductor integrated circuits multilayer structures of dielectric layers and patterned conducting layers are used to form the interconnections between discrete devices formed in or on a semiconductor substrate. Depending upon the levels of integration required, one or more conducting layers with the appropriate interconnection patterns are formed alternately with interlevel dielectric layers and connections between the metal layers are provided by "via plugs" or "via studs".

Typically in highly dense, sub micron-size integrated circuit devices, where small features are desired, three, four or more levels of interconnection metallization may be required. Also, it becomes necessary that each level of interconnection be applied to a planar surface, so that CMP (Chemical Mechanical Polishing) becomes a requisite process for fabrication of the multilevel structures.

Therefore, it is imperative that the multiple layers of dielectric materials and conducting materials be compatible in terms of mutual adhesion and chemical stability. Also, the manufacturing processes used for the individual layers, such as deposition processes, pattern formation processes and planarization processes, must be compatible with both previously deposited layers and with subsequently deposited layers and the steps of forming thereof. For example, during manufacturing process heat treatment steps the mutual adhesion between multiple layers must not be degraded and result in delamination of layers.

Also, as circuit density increases the RC (resistance X capacitance) delay becomes increasingly critical. In order to reduce the RC delay the higher conductivity of copper compared to aluminum offers improvement and lower dielectric constant insulators are desirable to replace $SiO_2$ which has a dielectric constant (k) of approximately 4.0. FSG (F doped $SiO_2$), having k~3.5, is a candidate for a low-k dielectric.

However, when using FSG (F doped $SiO_2$) in composite dielectric layers as shown in FIG. 1, where the FSG (F doped $SiO_2$) layer 10 is passivated by a two-layer passivation layer comprising undoped silicon oxide 11 deposited by HDP (High Density Plasma) deposition and silicon nitride 12 deposited by plasma enhanced deposition onto the undoped silicon oxide 11, delamination of the FSG layer occurs during subsequent manufacturing heat treatment cycles. The cause of this delamination is believed to be due to outdiffusion of F atoms from the FSG layer through the undoped silicon oxide and into the silicon nitride layer. During heat treatment cycles the FSG layer reacts with the silicon nitride layer, delamination bubbles occur, and the FSG layer begins to peel.

Therefore, an important challenge in the fabrication of multilevel dielectric structures involving FSG and silicon nitride layers is to prevent delamination of these layers during and subsequent to their deposition.

Numerous patents address processes of protecting dielectric layers and metal layers from deleterious effects during subsequent processing steps. For example, U.S. Pat. No. 5,830,804 entitled "Encapsulated Dielectric And Method Of Fabrication" granted Nov. 3, 1999 to James M. Cleeves shows SRO (Silicon Rich Oxide) used as an encapsulating layer to seal a sensitive dielectric, such as spin-on-glass or polyimide, to prevent their attack and/or outgassing during subsequent processing steps.

U.S. Pat. No. 5,567,635 entitled "Method Of Making A Three Dimensional Trench EEPROM Cell Structure" granted Oct. 22, 1996 to Alexandre Acovic et al. teaches the use of a SRO (Silicon Rich Oxide) layer as a capacitor layer in an EEPROM (Electrically Erasable Programmable Read Only Memory) cell structure.

U.S. Pat. No. 5,858,875 entitled "Integrated Circuits With Borderless Vias" granted Jan. 12, 1999 to Henry Wei-Ming Chung et al. describes a method of forming metal lines using etch stop layers.

U.S. Pat. No. 5,756,396 entitled "Method Of Making A Multi-Layer Wiring Structure Having Conductive Sidewall Etch Stoppers And A Stacked Plug Interconnect" granted May 26, 1998 to Chung-Kuang Lee et al. describes a method of electrically connecting two wiring layers in which conductive sidewall spacers composed of titanium nitride and tungsten are formed on a first layer metal wiring pattern. The sidewall spacers act as an etch stop for a via etch to contact the first layer metal wiring pattern and also increase the contact area of the wiring layers. A tungsten plug with an outer Tin barrier layer is formed filling the via contacting the first layer metal wiring pattern and then a second layer metal wiring pattern is formed also having TiN and tungsten sidewall spacers. The second layer sidewall spacers, also, fill in the TiN plug barrier layer.

The present invention is directed to a novel composite dielectric structure and method of forming thereof which prevents delamination of FSG (F-doped $SiO_2$) and allows FSG to be used in combination with plasma deposited silicon nitride without deleterious peeling or delamination during heat treatment cycles applied subsequently to the formation of the FSG and silicon nitride dielectric layers.

SUMMARY OF THE INVENTION

It is a general object of the present invention to provide an improved composite dielectric structure and method of forming thereof which prevents delamination of FSG (F-doped $SiO_2$) and allows FSG to be used in combination with plasma deposited silicon nitride without deleterious peeling or delamination during heat treatment cycles applied subsequently to the formation of the FSG and silicon nitride dielectric layers.

A more specific object of the present invention is to provide an improved composite dielectric structure and method of forming thereof which prevents delamination of FSG (F-doped $SiO_2$) and allows FSG to be used as the interlevel dielectric between successive conducting interconnection patterns in multilevel integrated circuit structures.

In accordance with the present invention, the above and other objectives are realized by using a method of fabricating a multiple layer interlevel dielectric composite on a semiconductor substrate comprising the steps of: providing a semiconductor substrate; forming a first dielectric layer, comprising FSG (F doped $SiO_2$), onto said semiconductor substrate; forming a second dielectric layer, comprising undoped silicon oxide deposited by HDP (High Density Plasma) deposition, onto said first dielectric layer; forming a third dielectric layer, comprising silicon-rich silicon oxide deposited by HDP (High Density Plasma) deposition, onto said second dielectric layer; and forming a fourth dielectric layer, comprising silicon nitride deposited by plasma enhanced deposition, onto said third dielectric layer.

In a second embodiment of the present invention, the above and other objectives are realized by using a method of fabricating a multiple layer interlevel dielectric composite on a semiconductor substrate comprising the steps of: providing a semiconductor substrate; forming a first dielectric layer, comprising FSG (F doped $SiO_2$), onto said semiconductor substrate; forming a second dielectric layer, comprising silicon-rich silicon oxide deposited by HDP (High Density Plasma) deposition, onto said first dielectric layer; and forming a third dielectric layer, comprising silicon nitride deposited by plasma enhanced deposition, onto said second dielectric layer.

In a third embodiment of the present invention, the above and other objectives are realized by an improved multiple layer interlevel dielectric composite structure for use between successive layers of conducting interconnection patterns on a semiconductor substrate, formed from a first dielectric layer comprising FSG (F doped $SiO_2$) deposited onto said semiconductor substrate, a second dielectric layer comprising undoped silicon oxide deposited by HDP (High. Density Plasma) deposition onto said first dielectric layer, a third dielectric layer comprising silicon-rich silicon oxide deposited by HDP (High Density Plasma) deposition onto said second dielectric layer, and a fourth dielectric layer comprising silicon nitride deposited by plasma enhanced deposition onto said third dielectric layer.

And in yet a fourth embodiment of the present invention, the above and other objectives are realized by an improved multiple layer interlevel dielectric composite structure for use between successive layers of conducting interconnection patterns on a semiconductor substrate, formed from a first dielectric layer comprising FSG (F doped $SiO_2$) deposited onto said semiconductor substrate, a second dielectric layer comprising silicon-rich silicon oxide deposited by HDP (High Density Plasma) deposition onto said first dielectric layer, and a third dielectric layer comprising silicon nitride deposited by plasma enhanced deposition onto said second dielectric layer.

BRIEF DESCRIPTION OF THE DRAWINGS

The object and other advantages of this invention are best described in the preferred embodiments with reference to the attached drawings that include:

FIG. 1, which in cross-sectional representation illustrates a conventional composite dielectric structure comprising FSG passivated with undoped silicon oxide and silicon nitride layers.

FIG. 2, which in cross-sectional representation illustrates an improved composite dielectric structure comprising FSG passivated with undoped silicon oxide, silicon-rich silicon oxide and silicon nitride layers.

DESCRIPTION OF THE PREFERRED EMBODIMENTS

Figure 3:
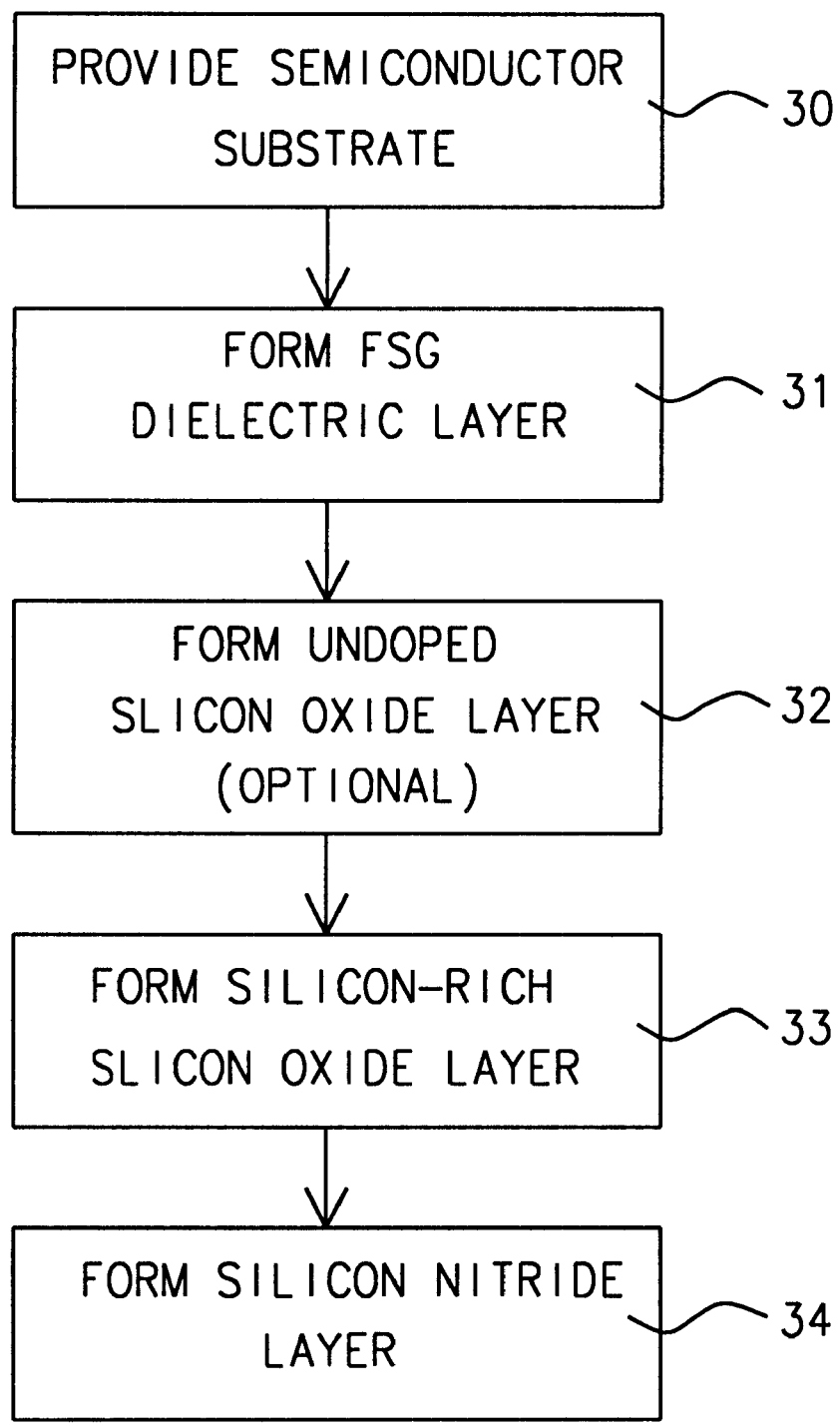
FIG. 3 is a flow chart of the method of the preferred embodiment of the present invention.

The new and improved composite dielectric structure and method of forming thereof which prevents delamination of FSG (F-doped $SiO_2$) and allows FSG to be used in combination with plasma deposited silicon nitride without deleterious peeling or delamination during heat treatment cycles applied subsequently to the formation of the FSG and silicon nitride dielectric layers will now be described in detail.

Referring to FIG. 2, semiconductor substrate 20 is provided and contains device elements such as active and passive devices, which are not illustrated in FIG. 2 since they are not part of the present invention. A first dielectric layer 21 comprising FSG (F doped $SiO_2$) is formed onto the semiconductor substrate 20. The first dielectric layer 21 comprising FSG (F doped $SiO_2$) is formed by CVD (Chemical Vapor Deposition) at about 400° C. using $Si_4$, $SiF_4$, $O_2$ and argon and has a thickness between about 4000 and 20,000 Angstroms. An optional second dielectric layer 22 comprising undoped silicon oxide deposited by HDP (High Density Plasma) deposition is formed onto the first dielectric layer 21. The optional second dielectric layer 22 comprising undoped silicon oxide is formed by HDP (High Density Plasma) deposition using $SiH_4$, $N_2O$ and argon and has a thickness between about 500 and 2000 Angstroms. A third dielectric layer 23 comprising silicon-rich silicon oxide deposited by HDP (High Density Plasma) deposition is formed onto the second dielectric layer. Alternately, the dielectric layer 23 is formed onto the first dielectric layer 21 when the optional second dielectric layer 22 is omitted from the structure. The dielectric layer 23 comprising silicon-rich silicon oxide is formed by HDP (High Density Plasma) deposition using $SiH_4$, $N_2O$ and argon and has a thickness between about 1000 and 2000 Angstroms. The silicon-rich silicon oxide layer 23 is the key element in preventing reaction of FSG layer 21 with subsequently deposited silicon nitride passivation layer 24. The silicon-rich silicon oxide layer 23 should have a thickness of at least between 1000 and 2000 Angstroms. A final dielectric layer 24 comprising silicon nitride deposited by plasma enhanced deposition is formed onto the silicon-rich silicon oxide layer 23. The final dielectric layer 24 comprising silicon nitride is formed by plasma enhanced deposition using $SiH_4$, $NH_3$ and argon and has a thickness between about 500 and 2000 Angstroms. The silicon-rich silicon oxide layer 23, having a thickness between about 1000 and 2000 Angstroms, prevents reaction of F atoms from the FSG layer 21 with the silicon nitride layer 24 during subsequent manufacturing heat treatment cycles and prevents the deleterious formation of delamination bubbles which cause peeling of the FSG layer.

Referring to FIG. 3, which is a flow chart of the method of the preferred embodiment of the present invention, Step 30 provides a semiconductor substrate. Step 31 forms FSG dielectric layer onto the semiconductor substrate. Optional Step 32 forms undoped silicon oxide onto the FSG dielectric layer. Step 33 forms silicon-rich silicon oxide onto the undoped silicon oxide layer or onto the FSG dielectric layer when the optional undoped silicon oxide layer is omitted. Finally, Step 34 forms a silicon nitride layer onto the silicon-rich silicon oxide layer.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a multiple layer interlevel dielectric composite on a semiconductor substrate comprising the steps:

providing a semiconductor substrate;

forming a first dielectric layer, comprising FSG, onto said semiconductor substrate;

forming a second dielectric layer, comprising undoped silicon oxide deposited by HDP deposition, onto said first dielectric layer;

forming a third dielectric layer, comprising silicon-rich silicon oxide deposited by HDP deposition, onto said second dielectric layer; and forming a fourth dielectric layer, comprising silicon nitride deposited by plasma enhanced deposition, onto said third dielectric layer.

2. The method of claim 1, wherein said first dielectric layer, comprising FSG, has a thickness in the range between about 4000 and 20,000 Angstroms.

3. The method of claim 1, wherein said first dielectric layer, comprising FSG, is formed by CVD at about 400° C. using $SiH_4$, $SiF_4$, $O_2$ and argon.

4. The method of claim 1, wherein said second dielectric layer, comprising undoped silicon oxide deposited by HDP deposition, has a thickness in the range between about 500 and 2000 Angstroms.

5. The method of claim 1, wherein said second dielectric layer, comprising undoped silicon oxide, is formed by HDP deposition using $SiH_4$, $N_2O$ and argon.

6. The method of claim 1, wherein said third dielectric layer, comprising silicon-rich silicon oxide deposited by HDP deposition, has a thickness in the range between about 1000 and 2000 Angstroms.

7. The method of claim 1, wherein said third dielectric layer, comprising silicon-rich silicon oxide, is formed by HDP deposition using $SiH_4$, $N_2O$ and argon.

8. The method of claim 1, wherein said fourth dielectric layer, comprising silicon nitride deposited by plasma enhanced deposition, has a thickness in the range between about 500 and 2000 Angstroms.

9. The method of claim 1, wherein said fourth dielectric layer, comprising silicon nitride, is formed by plasma enhanced deposition using $SiH_4$, $NH_3$ and argon.

10. A method of fabricating a multiple layer interlevel dielectric composite on a semiconductor substrate comprising the steps:

providing a semiconductor substrate;

forming a first dielectric layer, comprising FSG, onto said semiconductor substrate;

forming a second dielectric layer, comprising silicon-rich silicon oxide deposited by HDP deposition, onto said first dielectric layer; and forming a third dielectric layer, comprising silicon nitride deposited by plasma enhanced deposition, onto said second dielectric layer.

11. The method of claim 10, wherein said first dielectric layer, comprising FSG, has a thickness in the range between about 4000 and 20,000 Angstroms.

12. The method of claim 10, wherein said first dielectric layer, comprising FSG, is formed by CVD at about 400°C. using $SiH_4$, $SiF_4$, $O_2$ and argon.

13. The method of claim 10, wherein said second dielectric layer, comprising silicon-rich silicon oxide deposited by HDP deposition, has a thickness in the range between about 1000 and 2000 Angstroms.

14. The method of claim 10, wherein said second dielectric layer, comprising silicon-rich silicon oxide, is formed by HDP deposition using $SiH_4$, $N_2O$ and argon.

15. The method of claim 10, wherein said third dielectric layer, comprising silicon nitride deposited by plasma enhanced deposition, has a thickness in the range between about 500 and 2000 Angstroms.

16. The method of claim 10, wherein said third dielectric layer, comprising silicon nitride, is formed by plasma enhanced deposition using $SiH_4$, $NH_3$ and argon.

17. An improved multiple layer interlevel dielectric composite structure for use between successive layers of conducting interconnection patterns on a semiconductor substrate, formed from a first dielectric layer comprising FSG deposited onto said semiconductor substrate, a second dielectric layer comprising undoped silicon oxide deposited by HDP deposition onto said first dielectric layer, a third dielectric layer comprising silicon-rich silicon oxide deposited by HDP deposition onto said second dielectric layer and a fourth dielectric layer comprising silicon nitride deposited by plasma enhanced deposition onto said third dielectric layer.

18. The structure of claim 17, wherein said first dielectric layer comprising FSG has a thickness in the range between about 4000 and 20,000 Angstroms.

19. The structure of claim 17, wherein said first dielectric layer comprising FSG is formed by CVD at about 400°C. using $SiH_4$, $SiF_4$, $O_2$ and argon.

20. The structure of claim 17, wherein said second dielectric layer comprising undoped silicon oxide deposited by HDP deposition has a thickness in the range between about 500 and 2000 Angstroms.

21. The structure of claim 17, wherein said second dielectric layer comprising undoped silicon oxide is formed by HDP deposition using $SiH_4$, $N_2O$ and argon.

22. The structure of claim 17, wherein said third dielectric layer comprising silicon-rich silicon oxide deposited by HDP deposition has a thickness in the range between about 1000 and 2000 Angstroms.

23. The structure of claim 17, wherein said third dielectric layer comprising silicon-rich silicon oxide is formed by HDP deposition using $SiH_4$, $N_2O$ and argon.

24. The structure of claim 17, wherein said fourth dielectric layer comprising silicon nitride deposited by plasma enhanced deposition has a thickness in the range between about 500 and 2000 Angstroms.

25. The structure of claim 17, wherein said fourth dielectric layer comprising silicon nitride is formed by plasma enhanced deposition using $SiH_4$, $NH_3$ and argon.

26. An improved multiple layer interlevel dielectric composite structure for use between successive layers of conducting interconnection patterns on a semiconductor substrate, formed from a first dielectric layer comprising FSG deposited onto said semiconductor substrate, a second dielectric layer comprising silicon-rich silicon oxide deposited by HDP deposition onto said first dielectric layer and a third dielectric layer comprising silicon nitride deposited by plasma enhanced deposition onto said second dielectric layer.

27. The structure of claim 26, wherein said first dielectric layer comprising FSG has a thickness in the range between about 4000 and 20,000 Angstroms.

28. The structure of claim 26, wherein said first dielectric layer comprising FSG is formed by CVD at about 400°C. using $SiH_4$, $SiF_4$, $O_2$ and argon.

29. The structure of claim 26, wherein said second dielectric layer comprising silicon-rich silicon oxide deposited by HDP deposition has a thickness in the range between about 1000 and 2000 Angstroms.

30. The structure of claim 26, wherein said second dielectric layer comprising silicon-rich silicon oxide is formed by HDP deposition using $SiH_4$, $N_2O$ and argon.

31. The structure of claim 26, wherein said third dielectric layer comprising silicon nitride deposited by plasma enhanced deposition, has a thickness in the range between about 500 and 2000 Angstroms.

32. The structure of claim 26, wherein said third dielectric layer comprising silicon nitride is formed by plasma enhanced deposition using $SiH_4$, $NH_3$ and argon.

* * * * *